(12) United States Patent
Cok et al.

(10) Patent No.: US 7,292,614 B2
(45) Date of Patent: Nov. 6, 2007

(54) ORGANIC LASER AND LIQUID CRYSTAL DISPLAY

(75) Inventors: Ronald S. Cok, Rochester, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 64 days.

(21) Appl. No.: 10/668,415

(22) Filed: Sep. 23, 2003

(65) Prior Publication Data

US 2005/0062903 A1  Mar. 24, 2005

(51) Int. Cl.
*H01S 5/00* (2006.01)

(52) U.S. Cl. ...................... 372/43.01; 372/69

(58) Field of Classification Search ............... 349/96; 372/43.01
See application file for complete search history.

(56) References Cited

U.S. PATENT DOCUMENTS

| | | | |
|---|---|---|---|
| 5,727,014 A * | 3/1998 | Wang et al. ............... 372/96 |
| 5,995,531 A | 11/1999 | Gaw et al. ................ 372/96 |
| 6,055,262 A * | 4/2000 | Cox et al. ................. 372/96 |
| 6,154,479 A * | 11/2000 | Yoshikawa et al. ........ 372/96 |
| 6,208,391 B1 | 3/2001 | Fukushima et al. ....... 349/69 |
| 6,404,789 B1 | 6/2002 | Kopp et al. |
| 6,485,884 B2 | 11/2002 | Wolk et al. |
| 6,542,145 B1 | 4/2003 | Reisinger et al. ......... 345/102 |
| 6,785,320 B1 * | 8/2004 | Amos et al. .............. 372/102 |
| 6,825,963 B2 * | 11/2004 | Kittaka et al. ............. 359/237 |
| 6,876,143 B2 * | 4/2005 | Daniels ..................... 313/504 |
| 2001/0036212 A1 | 11/2001 | Kopp et al. |
| 2002/0079831 A1 | 6/2002 | He et al. .................... 313/504 |
| 2002/0085143 A1 | 7/2002 | Kim et al. |
| 2002/0106160 A1 | 8/2002 | Cox et al. |
| 2002/0121848 A1 | 9/2002 | Lee et al. .................. 313/112 |
| 2002/0196385 A1 | 12/2002 | He et al. ................... 349/61 |
| 2003/0007538 A1 * | 1/2003 | Jiang et al. ................ 372/75 |
| 2003/0025851 A1 | 2/2003 | Cheng ...................... 349/61 |
| 2003/0030371 A1 | 2/2003 | Liao et al. ................ 313/506 |
| 2004/0179566 A1 * | 9/2004 | El-Bahar ................... 372/45 |
| 2004/0190584 A1 * | 9/2004 | Spoonhower et al. ..... 372/108 |

OTHER PUBLICATIONS

U.S. Appl. No. 10/154,372, filed May 23, 2002, Keith B. Kahen et al.
U.S. Appl. No. 10/184,358, filed Jun. 27, 2002, Andrew D. Arnold et al.
U.S. Appl. No. 10/395,484, filed Mar. 24, 2003, John P. Spoonhower et al.
U.S. Appl. No. 10/445,980, filed May 27, 2003, Ronald S. Cok et al.
U.S. Appl. No. 10/602,143, filed Jun. 24, 2003, Ronald S. Cok et al.

(Continued)

*Primary Examiner*—Dung (Michael) T. Nguyen
(74) *Attorney, Agent, or Firm*—Stephen H. Shaw

(57) ABSTRACT

An asymmetric light emitting structure for producing polarized light that includes a light emitting layer having a plurality of light emitting species, wherein orientation of the light emitting species is uncontrolled. Receipt of the emitted light from the light emitting layer is accomplished via an asymmetric geometric element that also produces polarized light. Additionally, the asymmetric light emitting structure includes a means for excitation of the light emitting layer.

15 Claims, 5 Drawing Sheets

OTHER PUBLICATIONS

Axel Scherer et al., "Photonic Crystals For Confining, Guiding, And Emitting Light," IEEE Transactions on Nanotechnology, vol. 1, No. 1, Mar. 2002, pp. 4-11.

M. Boroditsky et al., "Light Extraction From Optically Pumped Light-emitting Diode By Thin-slab Photonic Crystals," applied Physics Letters, vol. 75, No. 8, Aug. 23, 1999, pp. 1036-1038.

"Vertical-Cavity Surface-Emitting Lasers," edited by Carl W. Wilmsen et al. Cambridge University Press, 1999.

Marko Loncar et al., "Low-Threshold Photonic Crystal Laser," Applied Physics Letters, vol. 81, No. 15, Oct. 7, 2002, pp. 2680-2682.

Qinghai Song et al., "Narrow-Band Polarized Light Emission From Organic Microcavity Fabricated By Sol-Gel Technique," Applied Physics Letters, vol. 82, No. 18, May 5, 2003, pp. 2939-2941.

S. Goeman et al., "First Demonstration Of Highly Reflective And Highly Polarization Selective Diffraction Greatings (GIRO-Gratings) For Long-Wavelength VCSEL's" IEEE Photonics Technology Letters, vol. 10, No. 9, Sep. 1998, pp. 1205-1207.

Dawn K. Gifford et al., "Extraordinary Transmission Of Organic Photoluminescence Through An Otherwise Opaque Metal Layer Via Surface Plasmon Cross Coupling," Applied Physics Letters, vol. 80, No. 20, May 20, 2002, pp. 3679-3681.

Dawn K. Gifford et al., "Emission Through One Of Two Metal Electrodes Of An Organic Light-Emitting Diode Via Surface-Plasmon Cross Coupling," Applied Physics Letters, vol. 81, No. 23, Dec. 2, 2002, pp. 4315-4317.

Michael F. Weber, et al. "Giant Birefringent Optics In Multilayer Polymer Mirrors," SCIENCE, vol. 287, Mar. 31, 2000, pp. 2451-2456.

* cited by examiner

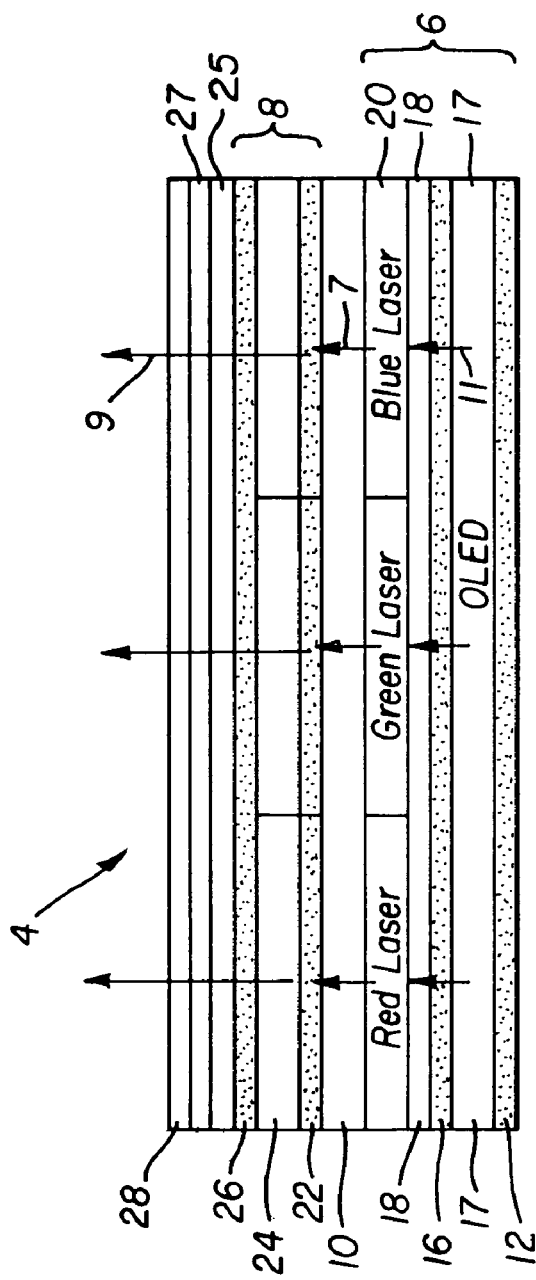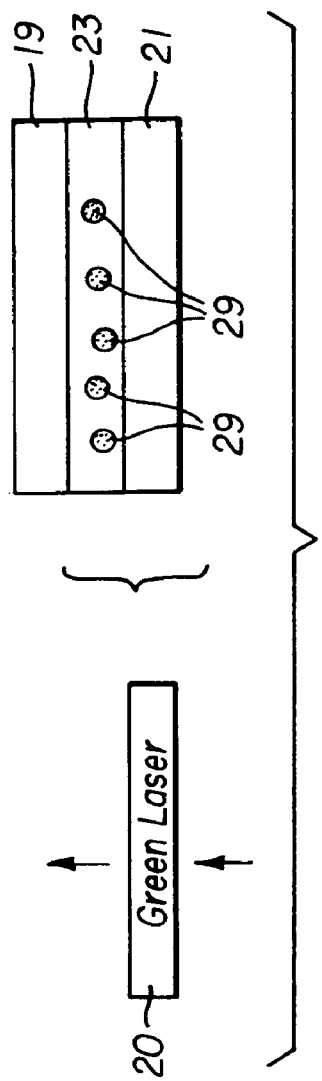

ORGANIC LASER AND LIQUID CRYSTAL DISPLAY

FIELD OF THE INVENTION

The present invention relates to organic light emitting devices and, more particularly to the use of organic light emitting devices as backlights in liquid crystal displays.

BACKGROUND OF THE INVENTION

Conventional transmissive liquid crystal displays (LCDs) use a white backlight, together with patterned color filter arrays (CFAs), to create colored pixel elements as a means of displaying color. Polarizing films polarize light. The pixels in a conventional liquid crystal display are turned on or off through the use of an additional layer of liquid crystals in combination with two crossed polarizer structures on opposite sides of a layer of polarizing liquid crystals. When placed in an electrical field with a first orientation, the additional liquid crystals do not alter the light polarization. When the electrical field is changed to a second orientation, the additional liquid crystals alter the light polarization. When light from the polarizing liquid crystals is oriented at ninety degrees to the orientation of the polarizing film in a first orientation, no light passes through the display, hence, creating a dark spot. In a second orientation, the liquid crystals do rotate the light polarization; hence, light passes through the crystals and polarizing structures to create a bright spot having a color as determined by the color filter array.

This conventional design for creating a display suffers from the need to use a polarizing film to create polarized light. Approximately one half of the light is lost from the backlight; thus, reducing power efficiency. Just as significantly, imperfect polarization provided by the polarizing film reduces the contrast of the display. Moreover, the required additional use of a color filter array to provide colored light from a white light source further reduces power efficiency. If each color filter for a tri-color red, green, and blue display passes one third of the white light, then two thirds of the white light is lost. Therefore, at least 84% of the white light generated by a backlight is lost.

The use of organic light emitting diodes (OLEDs) to provide a backlight to a liquid crystal display is known. For example, U.S. Patent Application Publication No. 2002/0085143 A1, by Jeong Hyun Kim et al., published Jul. 4, 2002, titled "Liquid Crystal Display Device And Method For Fabricating The Same," describes a liquid crystal display (LCD) device, including a first substrate and a second substrate; an organic light emitting element formed by interposing a first insulating layer on an outer surface of the first substrate; a second insulating layer and a protective layer formed in order over an entire surface of the organic light emitting element; a thin film transistor formed on the first substrate; a passivation layer formed over an entire surface of the first substrate including the thin film transistor; a pixel electrode formed on the passivation layer to be connected to the thin film transistor; a common electrode formed on the second substrate; and a liquid crystal layer formed between the first substrate and the second substrate.

A method for fabricating the LCD in U.S. Patent Application Publication No. 2002/0085143 A1 includes the steps of forming a first insulating layer on an outer surface of a first substrate; forming an organic light emitting element on the first insulating layer; forming a second insulating layer over an entire surface of the organic light emitting element; forming a protective layer on the second insulating layer; forming a thin film transistor on the first substrate; forming a passivation layer over an entire surface of the first substrate including the thin film transistor; forming a pixel electrode on the passivation layer; and forming a liquid crystal layer between the first substrate and a second substrate. However, this prior art design does not disclose a means to increase the efficiency of the LCD.

U.S. Pat. Nos. 6,485,884 issued Nov. 26, 2002 to Martin B. Wolk et al., titled "Method For Patterning Oriented Materials For Organic Electronic Displays And Devices" discloses the use of patterned polarized light emitters as a means to improve the efficiency of a display. The method includes selective thermal transfer of an oriented, electronically active, or emissive material from a thermal donor sheet to a receptor. The method can be used to make organic electroluminescent devices and displays that emit polarized light. There remains a problem, however, in that there continues to exist incomplete orientation of the electronically active or emissive material from a thermal donor sheet to a receptor. Hence, the polarization of the emitted light is not strictly linearly polarized, therefore, the light is incompletely polarized.

There is a need, therefore, for an alternative backlight and a novel display design that improves the efficiency of polarized light production, thus and thereby improving the overall efficiency of a liquid crystal display that incorporates the alternative backlight.

SUMMARY OF THE INVENTION

The present invention is directed to overcoming one or more of the problems set forth above by providing an improved asymmetric light emitting structure for producing polarized light, comprising: a) a light emitting layer having a plurality of light emitting species, wherein orientation of the light emitting species is uncontrolled; b) an asymmetric geometric element that receives emitted light from the light emitting layer and produces polarized light; and c) means for excitation of the light emitting layer.

ADVANTAGES

The present invention has the advantage that a simple integrated structure can be employed to create a white light emitting device with polarized light output and thereby improve the overall efficiency for a liquid crystal display.

BRIEF DESCRIPTION OF THE DRAWINGS

FIG. 2A is a schematic side view of another embodiment of the present invention using a coherent light source for providing polarized light;

FIG. 2B is a schematic side view of a vertical cavity laser structure;

DETAILED DESCRIPTION OF THE INVENTION

Figure 1:
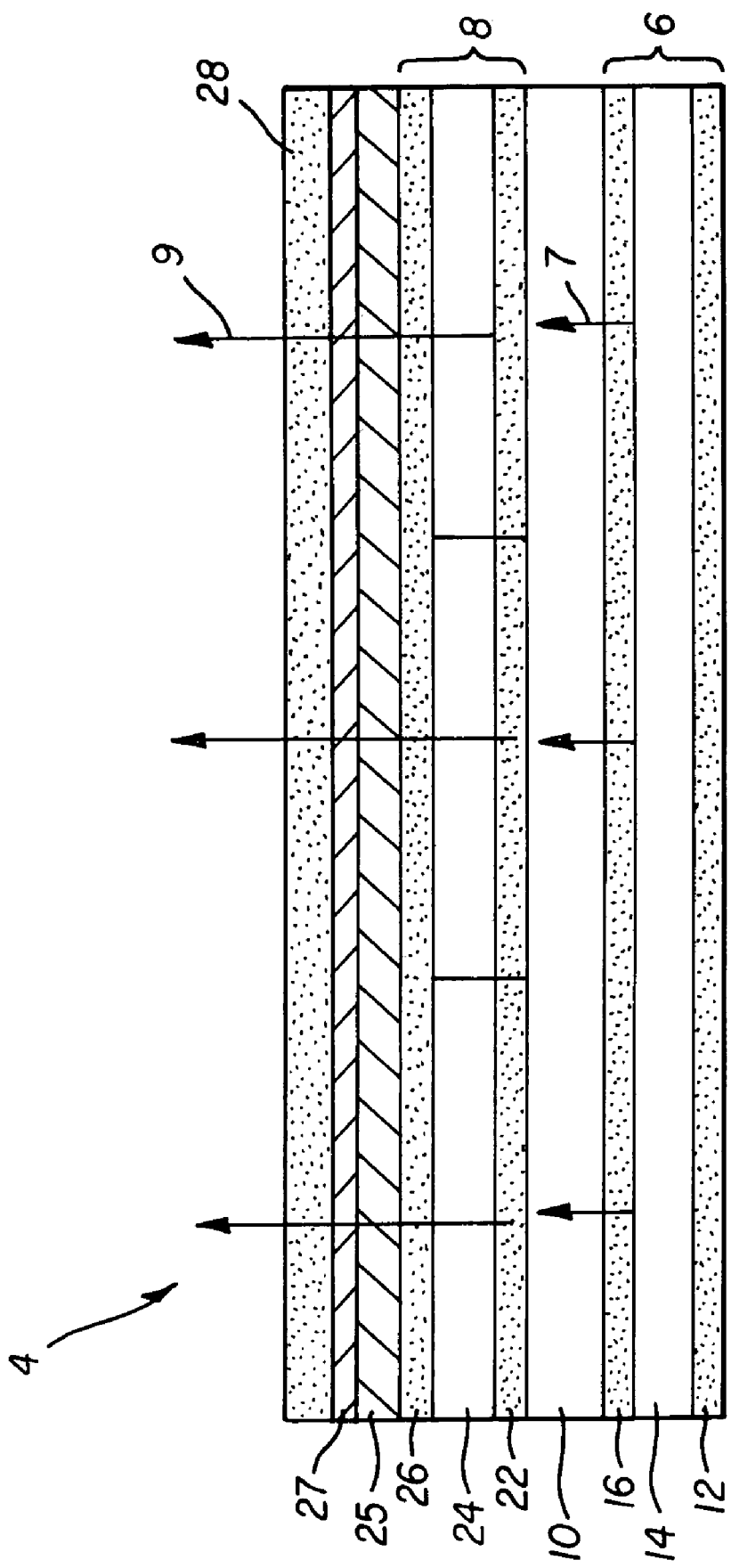
FIG. 1 is a schematic side view of one embodiment of the present invention.

Referring to FIG. 1, a display 4, according to the present invention, includes a substrate 10 having a first and second side. On a first side, an asymmetric light emitting structure 6 capable of producing polarized light 7 is formed. The asymmetric light emitting structure 6 is used to produce the polarized light 7 that travels through the substrate 10. On the second side of the substrate 10, a transmissive liquid crystal (LC) element 8 is formed having a first liquid crystal electrode 22, a liquid crystal layer 24, and a second liquid crystal electrode 26. The liquid crystal electrodes 22 and 26 provide independently, electrically controlled elements for a pixilated LCD, as is known in the art. The liquid crystal electrodes 22 and 26 can apply an electrical field across the liquid crystal layer 24, so that in one state the liquid crystal layer 24 is transmissive and in another state the liquid crystal layer 24 is not transmissive. Depending on the state of the liquid crystal layer 24, the polarized light 7 is transmitted through the liquid crystal layer 24 to form transmitted polarized light 9.

The control and construction of the liquid crystal electrodes 22 and 26 and liquid crystal layer 24 are well known in the art. Display 4 includes a polarizer layer 25 and an anti-reflection layer 27 that improves the contrast of the display. Diffuser layer 28 controls the angular distribution of the light as seen by the viewer, and is optional. The asymmetric light emitting structure 6 also includes at least one light emitting layer 14. In a conventional LCD a bottom polarizing layer is formed between substrate 10 and the LC element 8 to produce polarized light from unpolarized incident light to provide a backlight. In the present invention disclosed herein, a bottom polarizing layer is not necessary. Electrodes 12 and 16 are used to excite the light emitting layer 14.

The polarized light 7 emitted from the asymmetric light emitting structure 6 may be either coherent or incoherent. Referring to FIG. 2A, a coherent source of polarized light 7 may be formed, according to one embodiment of the present invention, by first providing a substrate 10 having a first and a second side. A vertical cavity laser structure 20 that produces colored, polarized light 7 is formed on the first side of substrate 10. Referring to FIG. 2B, the vertical cavity laser structure 20 has a light emitting layer 23 that possesses a plurality of light emitting species 29, wherein orientation of the light emitting species 29 is uncontrolled. Vertical cavity laser structures 20 are known in the art and disclosed, for example, in references cited below. The light emitting layer 23 has mirrors 19 and 21 placed above and below that form an optical cavity structure. A number of materials may be used for the light emitting layer 23 including materials with a high light emitting quantum yield. Specifically, light emitting species 29 typically include organic dyes, polymers, thin film semiconductor materials, such as CdSe, CdS, ZnS, ZnSe, and quantum dots (small nanocrystals) fabricated from these materials and coated in a binder. Typical quantum dots include CdSe quantum dots; typical binders are polymeric materials. Materials fabricated from Group II and Group VI elements of the periodic table form highly emissive materials in thin film form; similarly Group III and Group V elements can be made into emissive compounds as is well known in the art.

Referring to FIG. 2A, the polarized output of the vertical cavity laser structure 20 results from an asymmetric geometric element that is a part of the vertical laser cavity structure 20 and is described in greater detail below. The light emitting layer 23 (shown in FIG. 2B) receives emitted light from the light excitation layer 17. The light excitation layer 17 may have a pump layer for optically pumping the vertical cavity laser structure 20. A protective, transparent planarization layer 18 is located on the vertical cavity laser structure 20. Located upon the planarization layer 18 are a first electrode 16, a light excitation layer 17, such as an organic light emitting diode for emitting incoherent light 11 to pump the vertical cavity laser structure 20, and a second electrode 12. This combination of elements on the planarization layer 18 provides the means to excite the light emitting layer (shown in FIG. 2B) of the vertical laser cavity structure 20. The light excitation layer 17 typically generates incoherent light by means of electroluminescence. Organic light emitting diodes (OLED) are utilized in one embodiment of the present invention and may include layers such as light emissive layers, charge-injection layers, and charge-transport layers, as is known in the art. It is possible to use inorganic light emitting diodes either formed as a planar array or a linear array together with the use of a wedge wave-guide to provide an excitation source for generating incoherent light.

The vertical cavity laser structure 20 converts incoherent light to coherent light with a polarized output. On the second side of the substrate 10 a transmissive LC element 8 is formed, as described above with respect to FIG. 1; having a first independently controllable liquid crystal electrode 22 aligned with the vertical cavity lasers to control the colored light emitted from the vertical cavity lasers, a liquid crystal layer 24, and a second liquid crystal electrode 26. An optional diffuser layer 28 may be located above the electrode 26. Also included are polarizer layer 25 and anti-reflection layer 27 to improve the contrast of the display. In this embodiment, the asymmetric light emitting structure 6 is comprised of layers 12, 16, 17, 18, and 20 adjacent to the substrate 10.

The light excitation layer 17 and first and second electrodes 16 and 12, respectively, may not be independently controllable, and upon application of a current flowing between the first 16 and second 12 electrodes produces an incoherent light that simultaneously pumps all of the vertical cavity laser structures 20. The vertical cavity laser structures 20 emit polarized light 7 through the substrate 10 and the first liquid crystal electrode 22. The polarized light 7 passes through the first liquid crystal electrode 22. If the liquid crystal layer 24 is transmissive, a transmitted polarized light 9 passes through the liquid crystal layer 24 and the second liquid crystal electrode 26 and is ultimately emitted from display 4. If the liquid crystal layer 24 is not transmissive, the top polarizer layer 25 absorbs the transmitted polarized light 9. Alternatively, the light excitation layer 17 may be fabricated in a pixilated manner and registered with liquid crystal elements 8. Additionally, first and second electrodes 16 and 12, respectively may be independently controllable in concert with the liquid crystal electrodes 22 and 26, so that only those locations intended to emit light will do so. Note that no color filter array (CFA) is used in this embodiment.

If an electrical field is present between the first liquid crystal electrode 22 and the second liquid crystal electrode 26, the liquid crystals will align to a degree corresponding to the magnitude of the electrical field, thereby rotating the polarized light and allowing emission of the polarized light from the display. The mechanism by which the liquid crystals inhibit the passage of polarized light in response to an electrical field formed by electrodes involves rotation of the plane of polarization, and is well known in the art.

Figure 3:
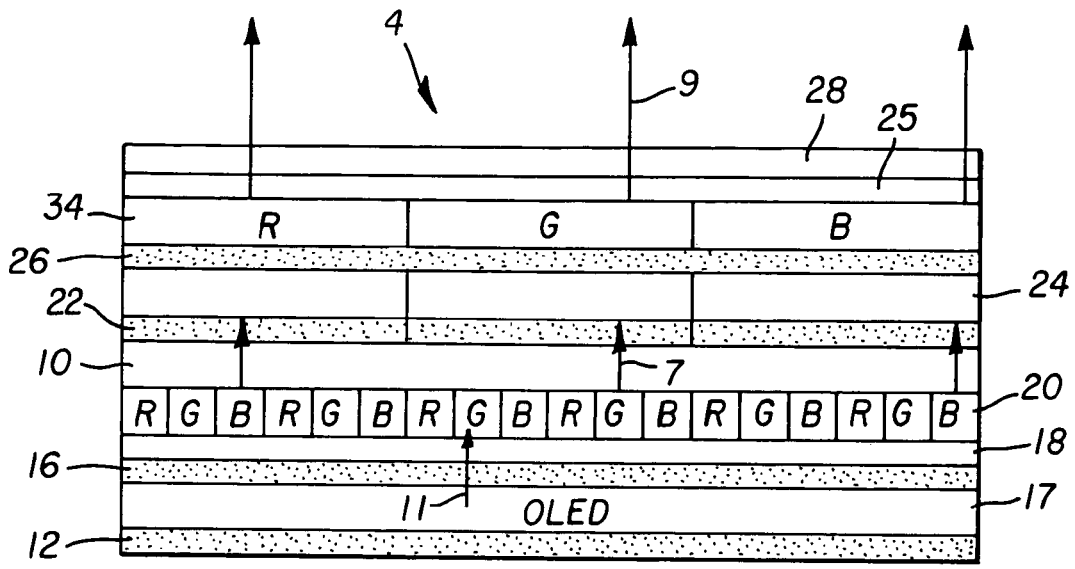
FIG. 3 is a schematic side view of an alternative embodiment of the present invention using a coherent light source for providing polarized light.

Referring to FIG. 3, in a second embodiment of the present invention, the vertical cavity structure 20 emits white, polarized light through a combination of small, pixilated, vertical microcavity laser elements having a variety of colors that, when combined, form a white polarized light. In this arrangement, adding color filters 34 above the liquid crystal layer 24 aids in forming the colored vertical microcavity laser elements. The deposition and formation of color filters with liquid crystal displays is well known in the prior art. Optional anti-reflection layer 27 is not shown, but could be included if desired.

Figure 4:
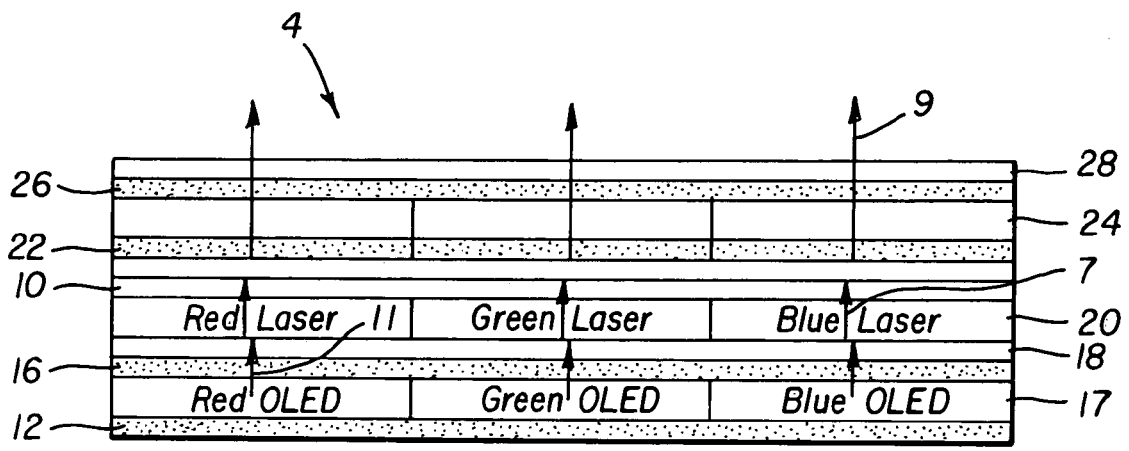
FIG. 4 is a schematic side view of yet another alternative embodiment of the present invention using a coherent light source for providing polarized light.

Referring to FIG. 4, the power efficiency of the arrangement shown in FIG. 3 may be improved by utilizing vertical cavity laser structures 20 that emit colored, polarized light 7, as shown in FIG. 1; but optically pumped by colored incoherent light 11 from the incoherent excitation layer 17. It is to be understood that the green OLED in FIG. 4 produces light that is substantially absorbed by the green laser vertical laser cavity structure 20 and is well suited for optical pumping of the green laser vertical laser cavity structure 20. Similarly, this is true for the blue OLED and associated blue laser, and for the red OLED and associated red laser. The material composition of these particular layers may vary or not depending on the overall display requirements. The frequency of the colored incoherent light 11 is chosen to optimally pump the vertical laser cavity structure 20. The incoherent light excitation layer 17 (and electrodes 12 and 16) may not be independently controlled in combination with the liquid crystal electrode 22. Alternatively, the incoherent light excitation layer 17 (by means of the electrodes 12 and 16) may be independently controlled in combination with the liquid crystal electrode 22. This arrangement provides a more power-efficient light pumping mechanism for the vertical cavity laser structures 20, since only those elements expected to emit light are powered.

Suitable vertical cavity laser structures 20 are described in detail in U.S. patent application Ser. No. 10/602,143, filed Jun. 24 2003, by Ronald S. Cok et al., titled "Incoherent Light-Emitting Device Apparatus For Driving Vertical Laser Cavity" and U.S. patent application Ser. No. 10/445,980, filed May 27, 2003, by Ronald S. Cok et al., titled "White-Light Laser," which are incorporated herein by reference. In these references, various means for the fabrication of cavity mirrors, light emitting layers, and lateral confinement structures are described. It is commonplace to refer to the light emitting layer 14 of the vertical cavity laser structures 20 as the active layer. Referring to FIG. 2B, the light emitting layer 23 is placed between mirror layers 19 and 21, to form an optical cavity structure. In general, light emitting layers are important to the fabrication of low threshold vertical laser cavity devices that are optically pumped by large area LED devices. The basic vertical cavity laser structure 20 consists of a light emitting layer 23 or layers that possess a plurality of light emitting species 29, wherein orientation of the light emitting species 29 is uncontrolled. Because the light emitting layer is optically excited, the emitting layer can be comprised of amorphous material and materials with high electrical transport characteristics are not required for high efficiency operation. This layer, or in alternative embodiments, multiple layers are formed between mirror elements that comprise an optical cavity. For example, in pending U.S. patent application Ser. No. 10/154,372, filed May 23, 2002, by Keith B. Kahen et al., titled "Organic Vertical Cavity Laser Array Device," which is incorporated herein by reference, control of the lateral extent of the optical field is used to establish arrays of individual micron-sized laser pixels that are phase-locked with each other. Modulating the reflectance of the bottom dielectric stack provides the micron-sized laser pixels of the device. The emission from the pixels is phase-locked, which enables the device to be driven by a large area source while the laser output remains mainly in a single lateral mode. Combining low-power density thresholds with pumping by large-area sources enables the devices to be optically driven by inexpensive, incoherent LED's. Other means are known in the art for producing such lateral confinement. For example, so-called photonic band-gap (PBG) structures can be used to confine the light field either laterally or along the direction of laser light emission. In "Photonic Crystals for Confining, Guiding, and Emitting Light," IEEE Transactions on Nanotechnology, Vol. 1, No. 1, March 2002, pages 4-11, Axel Scherer et. al. discloses the use of PBG structures both for light confinement and for the production of polarized emission. Similarly, in "Light Extraction From Optically Pumped Light-Emitting Diode By Thin-Slab Photonic Crystals," Applied Physics Letters, Vol. 75, No. 8, Aug. 23, 1999, pages 1036-1038. describes the improvement in light extraction efficiency from such incoherent LEDs patterned with adjacent 2-D photonic crystals.

Figure 5A:
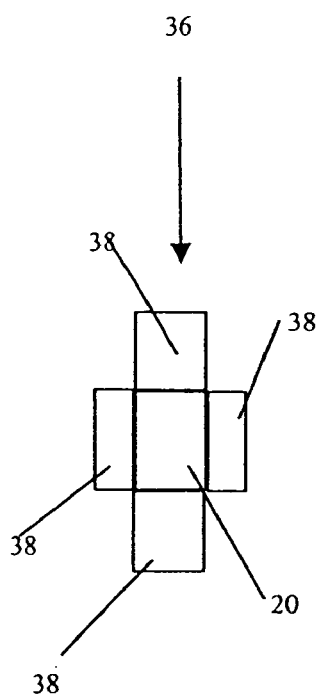
FIG. 5A is a schematic top view of a vertical cavity laser structure with an asymmetric geometric element.
Figure 5B:
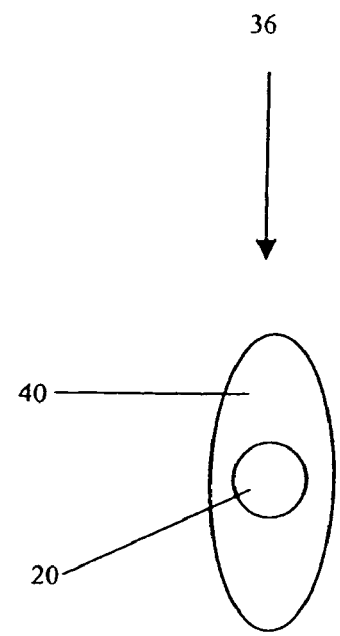
FIG. 5B is a schematic top view of a vertical cavity laser structure with an alternate asymmetric geometric element.
Figure 5C:
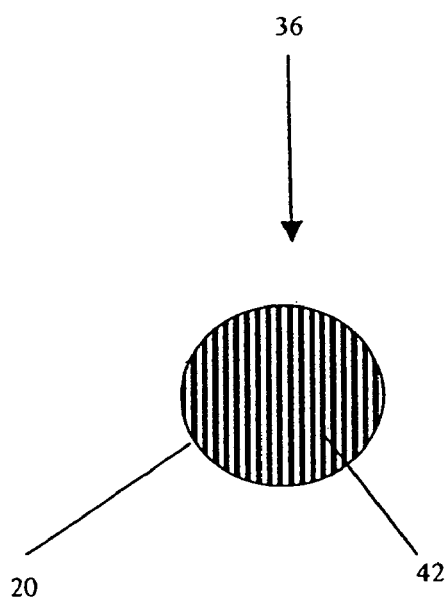
FIG. 5C is a schematic top view of a vertical cavity structure with an alternate asymmetric geometric element.

It is well known in the art of vertical cavity lasers that VCSELs offer the opportunity for polarization control. Geometrically symmetric VCSELs possess degenerate transverse modes with orthogonal polarization states. Consequently, it is necessary to break the symmetry of the VCSELS in order to force a particular mode of oscillation, and thus a particular polarization state. Such polarized output devices use an asymmetric geometric element to produce polarized light. In pending U.S. patent application No. 10/395,484, filed Mar. 24, 2003, by John P. Spoonhower et al., titled "Organic Fiber Laser System And Method," which is incorporated herein by reference, means for producing a polarized light output from an organic vertical cavity laser are disclosed. The asymmetric geometric elements may be a vertical cavity surface emitting laser 20 with asymmetric lateral confinement provided by reflectivity modulation of the cavity mirrors. FIG. 5A shows a schematic top view of a vertical cavity laser structure with an asymmetric geometric element 36 of this type. That is to say, the asymmetric geometric element 36 has a first dimension different from a second orthogonal dimension, as illustrated in FIGS. 5A-5C. A schematic top view of a vertical cavity laser structure 20 is shown with external lateral confinement structures 38 shown. Alternatively, the asymmetric geometric elements may be a vertical cavity surface emitting laser 20 with asymmetric lateral confinement provided by a photonic bandgap structure placed adjacent to the laser cavity. FIG. 5B shows a schematic top view of a vertical cavity laser structure with an asymmetric geometric element 36 of this type. The photonic bandgap 40 confines the lateral dimensions of the laser cavity in an asymmetric fashion.

Alternatively, the asymmetric geometric element may be a grating. FIG. 5C shows a schematic top view of a vertical cavity structure 20 with a grating 42 as the asymmetric geometric element 36. Where the asymmetric geometric element 36 is a grating, the grating preferably improves surface plasmon light output coupling for one polarization direction. Finally, FIG. 5D shows a schematic top view of a vertical cavity structure 20 with a grating as the asymmetric geometric element 36. A polarization selective mirror 44 provides for significant multipass gain within the laser cavity, but only for one preferred direction (indicated by the arrow in FIG. 5D). The vertical cavity laser structure 20 will achieve the threshold for laser oscillation at a lower pump power and oscillates in a mode with the preferred polarization output.

A number of methods for laser polarization control exist. In "Vertical-Cavity Surface-Emitting Lasers," by Carl W. Wilmsen et al., Cambridge University Press, 1999, for example, a specific control of polarization mode by the use of spatially asymmetric vertical cavity laser array elements, otherwise referred to herein as asymmetric geometric elements, is described. One mechanism for producing a laser output with stable single polarization is to reduce the size of the vertical cavity laser device in one dimension by means of asymmetric lateral confinement. For example, a rectangular vertical cavity laser device with dimensions 6×3.5 µm, exhibits increased diffraction loss of fundamental-mode emission by reducing its size from a fully symmetric device geometry (6×6 µm). This increased diffraction loss of fundamental-mode emission leads to pinning of the polarization laser emission direction. Likewise, Marko Loncar et. al. in "Low-Threshold Photonic Crystal Laser," Applied Physics Letters, Vol. 81, No. 15, Oct. 7, 2002, pages 2680-2682 describe the production of polarized laser light through the use of such photonic bandgap structures.

An alternative PBG structure, the so-called chiral laser, is disclosed in U.S. Pat. No. 6,404,789, issued Jun. 11, 2002, to Victor Il'ich Kopp et al., titled "Chiral Laser Apparatus And Method," and in U.S. Patent Publication No. 2001/0036212, published Nov. 1, 2001, by Victor Il'ich Kopp et al., titled "Chiral Laser Utilizing a Quarter Wave Plate." These alternative PBG structures utilize cholesteric liquid crystals, in combination with light emitting layers, to produce a polarized, thin film, coherent light source. The laser light emission may be circularly or linearly polarized, depending on whether a quarter-wave plate is employed to convert the polarization type, as is disclosed in U.S. Patent Publication No. 2001/0036212 (referenced above).

Other methods for using organic materials in microcavities to create polarized light are also known. For example, one such method is described in "Narrow-Band Polarized Light Emission From An Organic Microcavity Fabricated By A Sol-Gel Technique," as disclosed by Qinghai Song et al., in Applied Physics Letters, Vol. 82, No. 18, May 5, 2003, pages 2939-2941. The light output of such a microcavity device consists of two narrow line light emission modes that are orthogonally polarized; i.e., the so-called TE and TM modes. The two modes are approximately equal in power, as a function of wavelength, and each mode's light intensity is maximum at the peak of the device's gain curve (in this case, 620 nm.). As the device is adjusted in angle with respect to the observer's direction, wavelengths of the individual polarization modes split. Through wavelength filtering, one of the polarized modes could be selected. Additionally, James A. Cox et. al. have disclosed an optical system using a guided mode grating resonant reflector filter for polarization and wavelength control of VCSELs in U.S. Patent Application Publication No. 2002/0106160, published Aug. 8, 2002, titled "Resonant Reflector For Increased Wavelength And Polarization Control."

Another asymmetric geometric element that produces polarized laser light uses polarization selective cavity elements. Any mechanism that affects the laser cavity's gain in an asymmetric fashion has the potential for producing polarized laser light output. Such effects have been demonstrated for inorganic VCSELs and include the use of polarization selective grating structures as mirror elements. These designs have been discussed, for example, in "First Demonstration Of Highly Reflective And Highly Polarization Selective Diffraction Gratings (GIRO-Gratings) For Long-Wavelength VCSEL's" by S. Goeman et. al., IEEE Photonics Technology Letters, Vol. 10, No. 9, September 1998, pages 1205-1207. Additionally, multilayer polarization selective mirrors, as described in "Giant Birefringent Optics In Multilayer Polymer Mirrors" by Michael F. Weber et. al., Science Vol. 287, Mar. 31, 2000, pages 2451-2456 could be employed as end mirrors when fabricating microcavity lasers.

Alternative means exist for producing polarized light using incoherent light emitters having a variety of structured elements. For example, structures utilizing surface plasmon effects produce polarized light. See, for example, "Extraordinary Transmission Of Organic Photoluminescence Through An Otherwise Opaque Metal Layer Via Surface Plasmon Cross Coupling" by Dawn K. Gifford et al., Applied Physics Letters, Vol. 80, No. 20, May 20, 2002, pages 3679-3681 and in "Emission Through One Of Two Metal Electrodes Of An Organic Light-Emitting Diode Via Surface-Plasmon Cross Coupling," by Dawn K. Gifford et al., Applied Physics Letters, Vol. 81, No. 23, Dec. 2, 2002, page 4315-4317. Gifford et al. disclose creating the grating geometry for photoluminescent surface plasmon coupling by exposing a photo-resist on glass with an interferometric pattern, followed by depositing subsequent layers that replicate the underlying surface profile.

Figure 6:
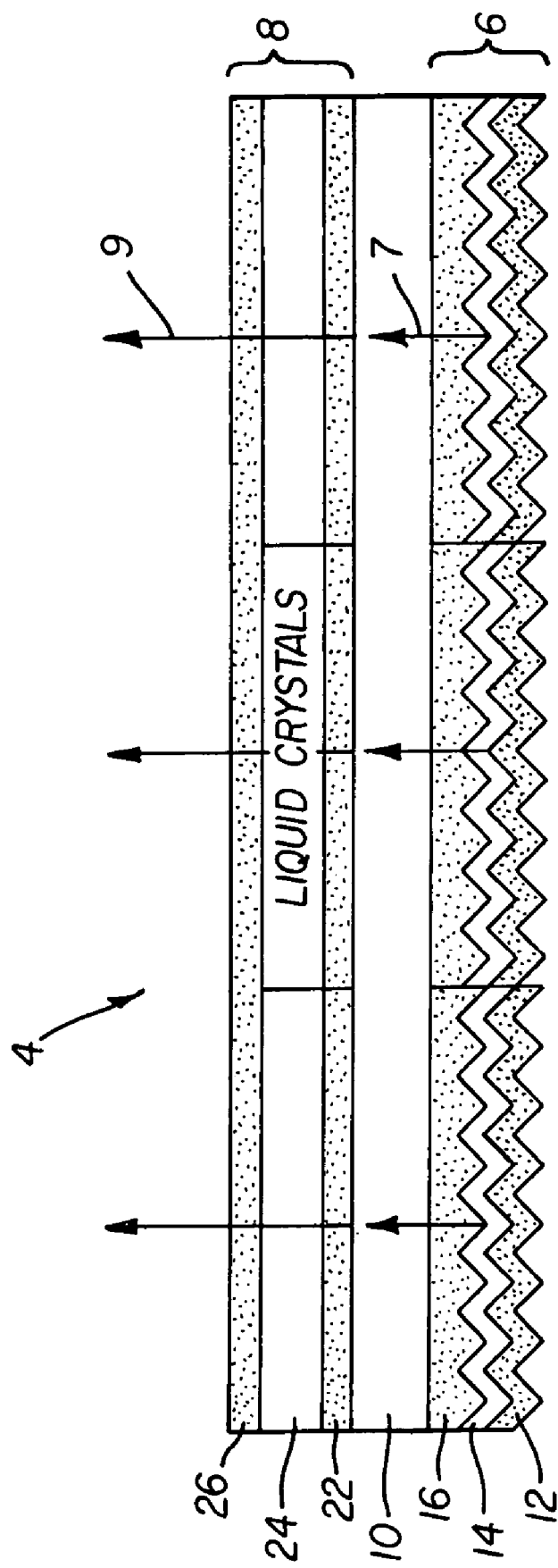
FIG. 6 is a schematic side view of an embodiment of the present invention using an alternative light source for providing polarized light.

By using such a previously described polarized, incoherent light emitter, the three-stage structure of FIG. 1 can be implemented in merely a two-stage structure as shown in FIG. 6. Referring to FIG. 6, a first electrode 12 can define a periodic grating structure. Such a structure can be formed by using known photolithographic techniques to pattern, for example, upon a planarization layer formed on a substrate 10 (as shown in FIG. 1). First and second electrodes 12 and 16, respectively; and a light emitting layer 14, for example an OLED layer, forms a periodic grating structure that emits polarized light 7. This polarized light 7 is emitted and is transmitted through the LCD layers depending on the state of the liquid crystal layer as described above. A light emitting layer 14 employing an OLED layer can contain multiple sub-layers such as light emissive layers, charge-injection layers, and charge-transport layers, as is known in the art. The light emitting layer 14 may be patterned as shown in FIG. 4 to emit polarized light 7 of different colors and aligned with the independently controlled elements of the liquid crystal layer 24. Alternatively, the light emitting layer 14 may be patterned with a plurality of smaller emitters having different colors that when combined form a white color so that, in aggregate, a white light is emitted from the independently controlled element.

The construction and control of the light emitting layer 14 is readily accomplished using a single, contiguous, conductive coating for electrodes 12 and 16. Alternatively, one of the electrodes either 12 or 16 may be patterned and individually controlled to provide light in association with the electrodes 22 and 26. Electrode 12 can be reflective, such that any light emitted away from the liquid crystal layer 24 is reflected toward the liquid crystal layer 24. Electrode 16 must be transparent to pass light from the light emitting layer 14 towards either the vertical cavity lasers 20 or directly through to the liquid crystal layer 24. Transmissive and reflective electrodes are well known in the art, as are substrate-coating techniques. Suitable structures are described in detail in pending U.S. patent application Ser. No. 10/184,358, filed Jun. 27, 2002 by Andrew D. Arnold, et al., titled "Organic Light Emitting Diode Display With Surface Plasmon Outcoupling," which is incorporated herein by reference. Construction of independently controlled electrodes 22 and 26 and the liquid crystal layer 24 are also well known in the art. In particular, active matrix control devices using thin-film technology may be employed to activate the independently controlled elements of the display.

The asymmetric light emitting structure 6 and the liquid crystal element 8 may be encapsulated within covers or transparent, protective coatings (not shown) using techniques known in the art. Both the covers or in the alternative the transparent, protective coatings may also serve as a substrate on which the successive layers are built and the substrate 10 is then a planarization layer deposited in sequence.

The invention has been described in detail with particular reference to certain preferred embodiments thereof, but it will be understood that variations and modifications can be effected within the spirit and scope of the invention.

PARTS LIST 4 display
6 asymmetric light emitting structure
7 polarized light
8 liquid crystal element
9 transmitted polarized light
10 substrate
11 incoherent light
12 electrode
14 light emitting layer
16 electrode
17 excitation layer
18 planarization layer
19 mirror
20 vertical cavity laser structure
21 mirror
22 first liquid crystal electrode
23 light emitting layer
24 liquid crystal layer
25 polarizer layer
26 second liquid crystal electrode
27 anti-reflection layer
28 diffuser layer
29 light emitting species
34 color filter
36 asymmetric geometric element
38 lateral confinement structure
40 photonic bandgap structure
42 grating structure
44 polarization selective mirror

What is claimed is:

1. An asymmetric light emitting structure for producing polarized light, comprising:
   a) an asymmetric geometric element that includes a light emitting layer responsive to light from an excitation layer for producing the polarized light, wherein the polarization direction of the light lies within the plane of the light emitting layer;
   b) wherein the asymmetric geometric element has a first dimension different from a second orthogonal dimension in the plane orthogonal to the direction of light emission;
   c) wherein the light emitting layer emits light orthogonal to the light emitting layer and includes a plurality of light emitting species having uncontrolled orientations with respect to each other; and
   d) means for excitation of the excitation layer.

2. The asymmetric light emitting structure claimed in claim 1, wherein the light emitting layer is comprised of materials selected from the group consisting of organic light emitting materials and inorganic light emitting materials.

3. The asymmetric light emitting structure claimed in claim 2, wherein the organic light emitting materials includes materials selected from the group consisting of polymers and dyes.

4. The asymmetric light emitting structure claimed in claim 2, wherein the inorganic light emitting materials includes materials selected from the group consisting of compounds from the periodic table found in group II, group VI, group III, and group V, and semi-conducting quantum dots fabricated from these same groups.

5. The asymmetric light emitting structure claimed in claim 1, wherein the asymmetric geometric element is a vertical cavity surface emitting laser with asymmetric lateral confinement.

6. The asymmetric light emitting structure claimed in claim 5, wherein the vertical cavity surface emitting laser is organic.

7. The asymmetric light emitting structure claimed in claim 5, wherein the vertical cavity surface emitting laser is inorganic.

8. The asymmetric light emitting structure claimed in claim 1, wherein the asymmetric geometric element is a grating.

9. The asymmetric light emitting structure claimed in claim 8, wherein the grating improves surface plasmon light output coupling.

10. The asymmetric light emitting structure claimed in claim 1, wherein the asymmetric geometric element is a photonic crystal with asymmetric lateral confinement.

11. The asymmetric light emitting structure claimed in claim 1, wherein the light emitting layer emits white light.

12. A method for producing polarized light from an asymmetric light emitting structure, comprising the steps of:
   a. exciting an excitation layer within the asymmetric light structure;
   b. providing light from the excitation layer to an asymmetric geometric element that includes a light emitting layer responsive to the light from the excitation layer that produces polarized light, wherein the polarization direction of the light lies within the plane of the light emitting layer;
   c. wherein the asymmetric geometric element has a first dimension different from a second orthogonal dimension in the plane orthogonal to the direction of light emission; and
   d. wherein the light emitting layer emits light orthogonal to the light emitting layer and includes a plurality of light emitting species having uncontrolled orientations with respect to each other.

13. The method claimed in claim 12, wherein the asymmetric geometric element is a vertical cavity surface emitting laser with asymmetric lateral confinement.

14. The method claimed in claim 13, wherein the vertical cavity surface emitting laser is organic.

15. The method claimed in claim 13, wherein the vertical cavity surface emitting laser is inorganic.

* * * * *